(12) United States Patent
Lu et al.

(10) Patent No.: US 12,057,390 B2
(45) Date of Patent: Aug. 6, 2024

(54) SOURCE/DRAIN ISOLATION STRUCTURE, LAYOUT, AND METHOD

(71) Applicant: TAIWAN SEMICONDUCTOR MANUFACTURING COMPANY, LTD., Hsinchu (TW)

(72) Inventors: Chi-Yu Lu, Hsinchu (TW); Yi-Hsun Chiu, Hsinchu (TW); Chih-Liang Chen, Hsinchu (TW); Chih-Yu Lai, Hsinchu (TW); Shang-Hsuan Chiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 254 days.

(21) Appl. No.: 17/752,704

(22) Filed: May 24, 2022

(65) Prior Publication Data
US 2023/0386998 A1    Nov. 30, 2023

(51) Int. Cl.
*H01L 23/522* (2006.01)
*H01L 23/498* (2006.01)
*H01L 23/528* (2006.01)
*H01L 29/06* (2006.01)

(52) U.S. Cl.
CPC .... *H01L 23/5226* (2013.01); *H01L 23/49827* (2013.01); *H01L 23/5286* (2013.01); *H01L 29/0649* (2013.01)

(58) Field of Classification Search
CPC .......... H01L 23/5226; H01L 23/49827; H01L 23/5286; H01L 23/535; H01L 29/0649
See application file for complete search history.

(56) References Cited

U.S. PATENT DOCUMENTS

| | | | |
|---|---|---|---|
| 10,304,819 B2* | 5/2019 | Kim | H01L 29/0673 |
| 10,490,544 B2* | 11/2019 | Chang | H01L 27/0207 |
| 2017/0110405 A1* | 4/2017 | Peng | H01L 21/76816 |
| 2020/0019672 A1* | 1/2020 | Peng | G03F 1/70 |
| 2021/0028314 A1* | 1/2021 | Saitoh | H01L 29/66969 |
| 2022/0067259 A1 | 3/2022 | Wang et al. | |
| 2022/0093646 A1 | 3/2022 | Wu et al. | |
| 2022/0293638 A1* | 9/2022 | Wang | H01L 27/1211 |

FOREIGN PATENT DOCUMENTS

| | | |
|---|---|---|
| TW | 200405523 | 4/2004 |
| TW | 202006915 | 2/2020 |
| TW | 202125716 | 7/2021 |
| TW | 202141638 | 11/2021 |
| TW | 202209162 | 3/2022 |

* cited by examiner

*Primary Examiner* — Dao H Nguyen
(74) *Attorney, Agent, or Firm* — Hauptman Ham, LLP

(57) ABSTRACT

An integrated circuit (IC) structure includes first and second active areas extending in a first direction in a semiconductor substrate, first and second gate structures extending in a second direction perpendicular to the first direction, wherein each of the first and second gate structures overlies each of the first and second active areas, a first metal-like defined (MD) segment extending in the second direction between the first and second gate structures and overlying each of the first and second active areas, and an isolation structure positioned between the first MD segment and the first active area. The first MD segment is electrically connected to the second active area and electrically isolated from a portion of the first active area between the first and second gate structures.

20 Claims, 13 Drawing Sheets

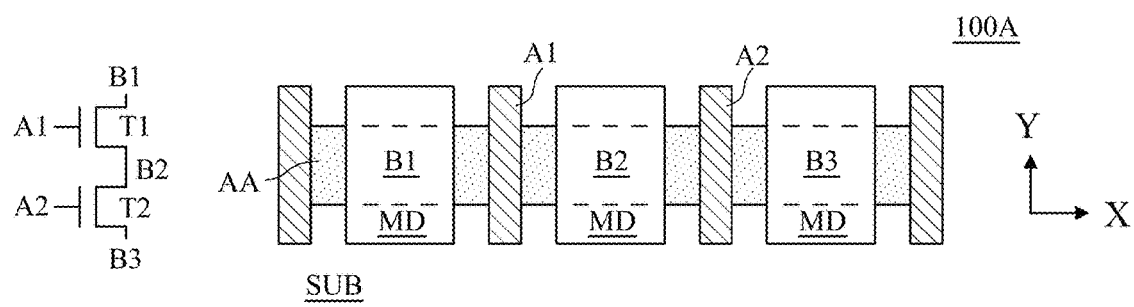
Fig. 1A
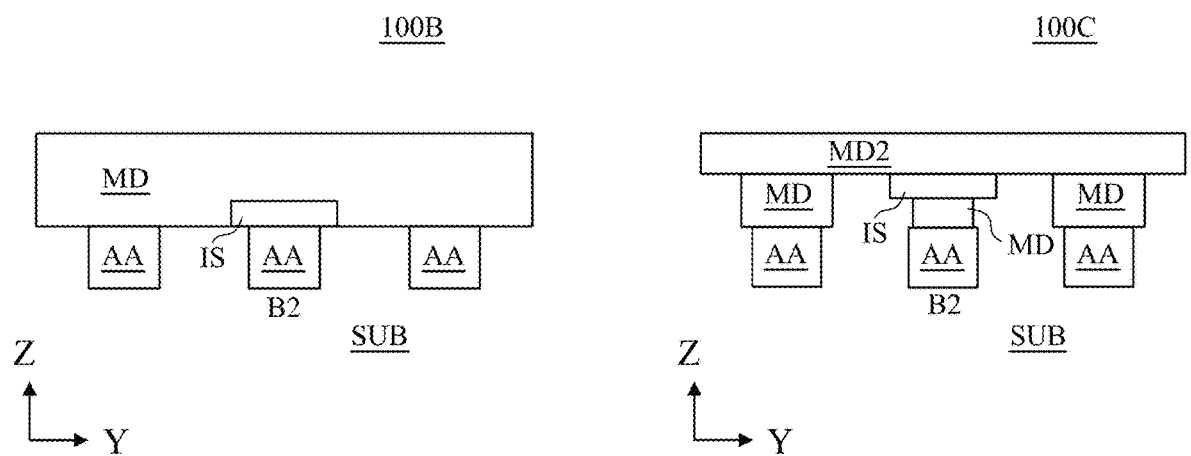
Fig. 1B
Fig. 1C

SOURCE/DRAIN ISOLATION STRUCTURE, LAYOUT, AND METHOD

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1E are diagrams of IC layout diagrams and corresponding IC structures, in accordance with some embodiments.

DETAILED DESCRIPTION

Figure 1D:
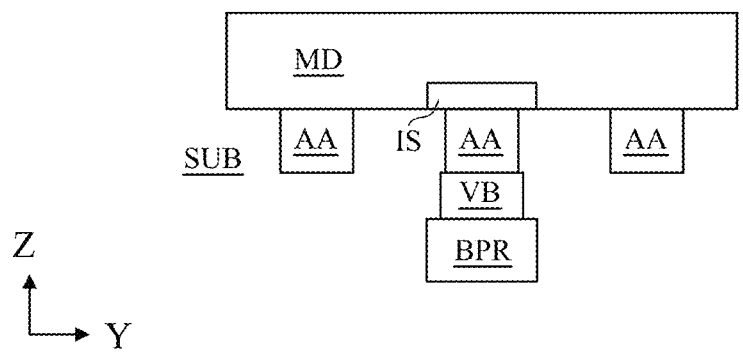

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC structure based on an IC layout diagram includes at least one isolation structure overlying a portion of an active area between two gate structures, e.g., a portion including a source/drain (S/D) structure. The isolation structure electrically isolates the active area portion from an overlying metal-like defined (MD) segment, whereby the overlying MD segment is capable of being included in an electrical path separate from a path that includes the active area portion, e.g., a series transistor connection or a power supply path. By including the MD segment, referred to as a source fly connection in some embodiments, in the electrical path, use of metal segments can be reduced or eliminated in various circuits, e.g., flip-flop circuits, thereby reducing costs and area compared to approaches that do not include an isolation structure between an MD segment and an underlying active area.

As discussed below, FIGS. 1A-7 depict plan views and cross-sectional views in some embodiments. Each of FIGS. 1A-7 is a structure/layout diagram in which the reference designators represent both IC structure features and the IC layout features used to at least partially define the corresponding IC structure features in a manufacturing process, e.g., a method 800 discussed below with respect to FIG. 8 and/or an IC manufacturing flow associated with an IC manufacturing system 1100 discussed below with respect to FIG. 11. In some embodiments, one or more of FIGS. 1A-7 is some or all of an IC layout diagram generated by executing some or all of the operations of a method 900 discussed below with respect to FIG. 9. Accordingly, each of FIGS. 1A-7 represents a plan or cross-sectional view of both an IC layout diagram and a corresponding IC structure.

Each of the figures herein, e.g., FIGS. 1A-7, is simplified for the purpose of illustration. The figures are views of IC layout diagrams, structures, and devices with various features included and excluded to facilitate the discussion below. In various embodiments, an IC structure, device and/or layout diagram includes one or more features corresponding to power distribution structures, metal interconnects, contacts, vias, gate structures, source/drain (S/D) structures, or other transistor elements, isolation structures, or the like, in addition to the features depicted in FIGS. 1A-7.

FIGS. 1A-1E are diagrams of IC layouts/structures 100A-100E including a portion of an active region/area AA between two gate regions/structures GS and electrically isolated from an overlying MD region/segment MD by an isolation structure IS. FIGS. 2A-2D are diagrams of IC layouts/structures 200A and 200C in which an overlying MD region/segment MD/MD2 is included along with a metal segment MO and via regions/structures VD in an electrical path between two active regions/areas AA. FIGS. 3A-3C are diagrams of IC layouts/structures 300A-300C in which an MD region/segment MD overlies one or more active areas AA. FIGS. 4-7 are diagrams of IC layouts/devices 400-700 corresponding to flip-flop circuits including MD regions/segments electrically isolated from active regions/areas by multiple instances of isolation structures IS.

In addition to a corresponding one of IC layouts/structures 100A-300C or IC layouts/devices 400-700, each of FIGS. 1A-7 depicts two of directions X, Y, or Z in accordance with the diagram perspective.

An active region, e.g., active region/area AA or AA1-AA4 discussed below, is a region in the IC layout diagram included in the manufacturing process as part of defining an active area, also referred to as an oxide diffusion or definition (OD), in a semiconductor substrate, e.g., a substrate SUB discussed below, either directly or in an n-well or p-well region/area (not shown for the purpose of clarity), in which one or more IC device features, e.g., a S/D structure, is formed. In some embodiments, an active area is an n-type or p-type active area of a planar transistor structure, a fin field-effect transistor (FinFET) structure, a gate-all-around (GAA) transistor structure, a nanosheet structure, or a nanowire structure. In various embodiments, an active area (structure) includes one or more of a semiconductor material, e.g., silicon (Si), silicon-germanium (SiGe), silicon-carbide (SiC), or the like, a dopant material, e.g., boron (B), phosphorous (P), arsenic (As), gallium (Ga), or another suitable material.

In some embodiments, a nano-sheet structure includes a continuous volume of one or more layers of one or more semiconductor materials having either n-type or p-type doping. In various embodiments, individual nano-sheet layers include a single monolayer or multiple monolayers of a given semiconductor material. In some embodiments, an active area, e.g., a nanosheet structure, includes one or more epitaxial layers, e.g., an epitaxial layer EPI discussed below.

An MD region, e.g., MD region/segment MD or a region/segment of one of pluralities of MD regions/segments D1-D13, is a conductive region in the IC layout diagram included in the manufacturing process as part of defining an MD segment, also referred to as a conductive segment or MD conductive line or trace, in and/or on the semiconductor substrate. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., the first metal layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more dopant materials having doping concentrations of about $1*10^{16}$ per cubic centimeter ($cm^{-3}$) or greater.

In some embodiments, e.g., the embodiments depicted in FIGS. 1B, 1D, 2A, 2B, 4, and 5, a manufacturing process includes a single MD layer, and an MD region/segment corresponds to MD region/segment MD or an MD region/segment of one of pluralities of MD regions/segments D1-D13. In some embodiments, e.g., the embodiments depicted in FIGS. 1C, 1E, 2C, 2D, 6, and 7, a manufacturing process includes two MD layers including first MD regions/segments MD and second MD regions/segments MD2, and the pluralities of MD regions/segments D1-D13 refer to both of the two MD layers in the manufacturing process.

In the various embodiments depicted in FIGS. 1A-7, some or all of the active region/area portions at which the MD regions/segments overlap/overlie a given active region/area correspond to S/D structures that are not further depicted for the purpose of clarity. Except as discussed below with respect to instances of isolation structure IS, a location at which an MD region/segment overlaps/overlies an active region/area corresponds to an electrical connection between the MD segment and the underlying active area portion and/or S/D structure.

The MD regions/segments of pluralities of MD regions/segments D1-D13 depicted in FIGS. 4-7 have configurations along the Y direction in accordance with cut-MD regions (not depicted for the purpose of clarity), also referred to as cut-metal regions in some embodiments. A cut-MD region is a region in the IC layout diagram included in the manufacturing process as part of defining a discontinuity in a given MD segment, thereby electrically isolating the corresponding adjacent MD segments from each other.

An isolation region/structure IS is a region in the IC layout diagram included in the manufacturing process as part of defining a volume including one or more insulating materials configured to electrically isolate an underlying feature, e.g., active area AA or AA1-AA4 or MD segment MD, from an overlying feature, e.g., MD segment MD or MD2. In various embodiments, the one or more insulating materials include silicon dioxide, silicon nitride ($Si_3N_4$), and/or another material suitable for providing a high resistance path between an underlying feature and an overlying feature, e.g., a resistance equal to or greater than a specified threshold for a given manufacturing process.

A gate region, e.g., gate region/structure GS or a gate region/structure of pluralities of gate regions/structures G1-G14 discussed below, is a region in the IC layout diagram included in the manufacturing process as part of defining a gate structure. A gate structure is a volume including one or more conductive segments, e.g., a gate electrode, including one or more conductive materials, e.g., polysilicon, copper (Cu), aluminum (Al), tungsten (W), cobalt (Co), ruthenium (Ru), or one or more other metals or other suitable materials, substantially surrounded by one or more insulating materials, the one or more conductive segments thereby being configured to control a voltage provided to an adjacent gate dielectric layer.

A dielectric layer, e.g., a gate dielectric layer, is a volume including one or more insulating materials, e.g., silicon dioxide, silicon nitride ($Si_3N_4$), and/or one or more other suitable material such as a low-k material having a k value less than 3.8 or a high-k material having a k value greater than 3.8 or 7.0 such as aluminum oxide ($Al_2O_3$), hafnium oxide ($HfO_2$), tantalum pentoxide ($Ta_2O_5$), or titanium oxide (TiO$_2$), suitable for providing a high electrical resistance between IC structure elements, i.e., a resistance level above a predetermined threshold corresponding to one or more tolerance levels of a resistance-based effect on circuit performance.

Pluralities of gate regions/structures G1-G14 have configurations along the Y direction in accordance with cut-gate regions (not depicted for the purpose of clarity), also referred to as cut-poly regions in some embodiments. A cut-gate region is a region in the IC layout diagram included in the manufacturing process as part of defining a discontinuity in the gate electrode of a given gate structure, thereby electrically isolating the corresponding adjacent portions of the gate electrode from each other.

A metal region, e.g., a metal region/segment MO or MS or power rail BPR, BPR1-BPR3, BP, or BP1-BP3 discussed below, is a region in the IC layout diagram included in the manufacturing process as part of defining a metal segment structure including one or more conductive materials, e.g., polysilicon, copper (Cu), aluminum (Al), tungsten (W), cobalt (Co), ruthenium (Ru), or one or more other metals or other suitable materials, in a given metal layer of the manufacturing process.

In the embodiments depicted in FIGS. 2A-2D and 4-7, instances of metal regions/segments MO and MS extend in the X direction in the first metal layer, also referred to as a metal zero layer in some embodiments. In the embodiments depicted in FIGS. 5 and 7, instances of metal regions/segments MS also extend in the Y direction in the second metal layer, also referred to as a metal one layer in some embodiments. In some embodiments, metal regions/segments MS otherwise extend in the X and Y directions in the metal layers, e.g., by extending in the Y direction in the first metal layer and extending in the X direction in the second metal layer.

In the embodiments depicted in FIGS. 1D, 2A, 2B, 4, and 5, each of power rails BPR, and BPR1-BPR3, also referred to as backside power rails BPR and BPR1-BPR3, corresponds to one or more metal layers formed in a back side of the semiconductor substrate as part of a backside manufacturing process. In the embodiments depicted in FIGS. 1E, 2C, 2D, 6, and 7, each of power rails BP and BP1-BP3 corresponds to a buried metal layer of the manufacturing process. In the various embodiments discussed below, a given one of power rails BPR, BPR1-BPR3, BP, or BP1-BP3 is configured to carry either a power supply voltage VDD or a power supply reference voltage VSS.

A via region, e.g., a via region/structure VD, VG, V0, or VB discussed below, is a region in the IC layout diagram included in the manufacturing process as part of defining a via structure including one or more conductive materials configured to provide an electrical connection between an overlying conductive structure and an underlying conductive structure. The overlying layer corresponds to a metal segment MO or MS in the case of a via region/structure VD, VG, or V0, and to an active region/area AA or AA1-AA4 in the case of a via region/structure VB. The underlying conductive structure corresponds to an MD segment or S/D structure in the case of a via region/structure VD, a gate electrode in the case of a via region/structure VG, a first metal layer region/segment, e.g., metal region/segment MS, in the case of a via region/structure V0, and a backside power rail BPR or BPR1-BPR3 in the case of a via region/structure VB.

In the case of a via region/structure VD, VG, or V0, the via structure thereby extends between two features positioned on a front side of the semiconductor substrate. In the case of a via region/structure VB, the via structure thereby extends from an active area positioned on the front side of the semiconductor substrate through the semiconductor substrate to a backside power rail.

FIG. 1A depicts a transistor series schematic diagram and corresponding plan view of an IC layout/structure 100A, in accordance with some embodiments. Transistor series 100A includes transistors T1 and T2, both of which are a same transistor type, either an n-type metal oxide semiconductor (NMOS) transistor or a p-type metal oxide semiconductor (PMOS) transistor.

Transistor T1 includes a gate A1 and S/D terminals B1 and B2, and transistor T2 includes a gate A2 and S/D terminals B2 and B3, S/D terminal B2 thereby being a shared S/D terminal of transistors T1 and T2.

Transistor series 100A includes portions of active region/area AA extending in the X direction in substrate SUB and portions of gate regions/structures A1 and A2 extending in the Y direction and overlapping/overlying active region/area AA. Instances of MD region/segment MD overlap/overlie active region/area AA at locations corresponding to S/D structures B1, B2, and B3. The instances of MD segment MD corresponding to S/D structures B1 and B3 are electrically connected to the underlying portions of active area AA, and the instance of MD segment MD corresponding to S/D structure B2 is electrically isolated from the portion of active area AA between gate structures A1 and A2 by isolation structure IS (not shown in FIG. 1A) in accordance with the embodiments depicted in FIGS. 1B and 1C.

FIG. 1B depicts a cross-sectional view of IC layout/structure 100B, in accordance with some embodiments, and FIG. 1C depicts a cross-sectional view of IC layout/structure 100C, in accordance with some embodiments. IC layout/structure 100B is an embodiment of transistor series 100A corresponding to a manufacturing process including a single MD layer, and IC layout/structure 100C is an embodiment of transistor series 100A corresponding to a manufacturing process including two MD layers.

Each of IC layouts/structures 100B and 100C includes three instances of active region/area AA, the middle instance including the portion between gate regions/structures A1 and A2 that corresponds to S/D structure B2. Isolation region/structure IS overlaps/overlies the active region/area portion corresponding to S/D structure B2.

In IC layout/structure 100B, isolation structure IS electrically isolates S/D structure B2 from MD segment MD. In IC layout structure 100C, S/D structure B2 is electrically connected to an overlying MD segment MD in the first MD layer, and isolation structure IS electrically isolates MD segment MD from an overlying MD segment MD2 in the second MD layer, thereby also electrically isolating S/D structure B2 from MD segment MD2.

In each of the embodiments depicted in FIGS. 1B and 1C, isolation structure IS thereby configured to isolate S/D structure B2 and the portion of active area AA between gate structures A1 and A1 from the corresponding overlying MD segment MD or MD2 such that each of MD segment MD of IC structure 100B and MD segment MD2 of IC structure 100C is capable of being included in an electrical path separate from S/D structure B2.

In the embodiments depicted in FIGS. 1B and 1C, the separate electrical path includes additional instances of active area AA adjacent to the instance including S/D structure B2, and in the case of IC structure 100C, additional instances of MD segment MD. In various embodiments, the separate electrical path includes elements and configurations other than those depicted in FIGS. 1B and 1C.

By including isolation region/structure IS and the corresponding MD region/segment MD or MD2, each of IC layouts/structures 100B and 100C includes an electrical path separate from S/D structure B2 of transistor series 100A, and including an MD segment whereby the use of metal segments can be reduced in a circuit that includes one of IC layouts/structures 100B or 100C, thereby reducing costs and area compared to approaches that do not include an isolation structure between an MD segment and an underlying active area.

Figure 1E:
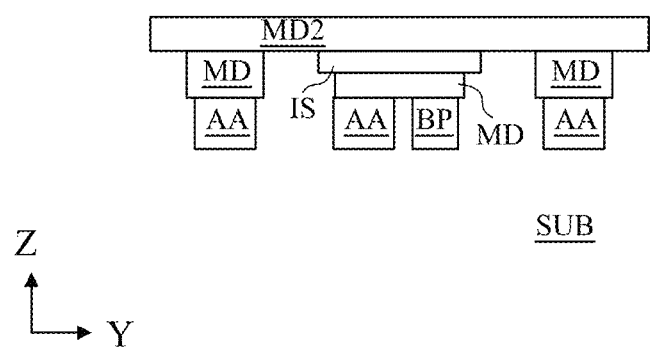

FIG. 1D depicts a cross-sectional view of IC layout/structure 100D, in accordance with some embodiments, and FIG. 1E depicts a cross-sectional view of IC layout/structure 100E, in accordance with some embodiments. IC layout/structure 100D corresponds to a manufacturing process including a single MD layer, and IC layout/structure 100E corresponds to a manufacturing process including two MD layers.

Each of IC layouts/structures 100D and 100E includes three instances of active region/area AA, isolation region/structure IS, and the corresponding instances of MD regions/structures MD and MD2 configured as discussed above with respect to FIGS. 1A-1C.

IC layout/structure 100D also includes a power rail BPR positioned in a back side of substrate SUB and via region/structure VB configured to electrically connect power rail BPR to the portion of the middle instance of active area AA underlying isolation structure IS.

IC layout/structure 100E also includes a buried power rail BP adjacent to the middle instance of active region/area AA and an instance of MD region/segment MD configured to electrically connect power rail BP to the portion of the middle instance of active area AA underlying isolation structure IS.

Each of IC layouts/structures 100D and 100E thereby includes an electrical path including the corresponding instance of MD region/segment MD or MD2 separate from the electrical connection to the corresponding power rail BPR or BP. In the embodiments depicted in FIGS. 1D and 1E, the separate electrical path includes additional instances of active area AA, and in the case of IC structure 100E, additional instances of MD segment MD. In various embodiments, the separate electrical path includes elements and configurations other than those depicted in FIGS. 1D and 1E.

A circuit that includes one of IC layouts/structures 100D or 100E is thereby capable of reducing the use of metal segments in electrical paths whereby the benefits discussed above with respect to IC layouts/structures 100B and 100C are obtained.

Figure 2A:
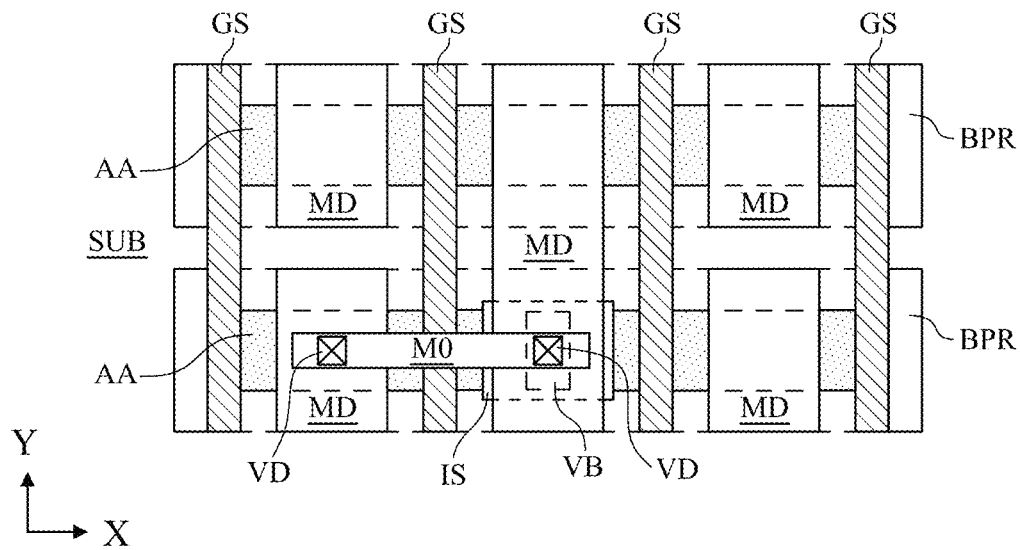
FIGS. 2A and 2B are diagrams of an IC layout diagram and corresponding IC structure, in accordance with some embodiments.
Figure 2B:
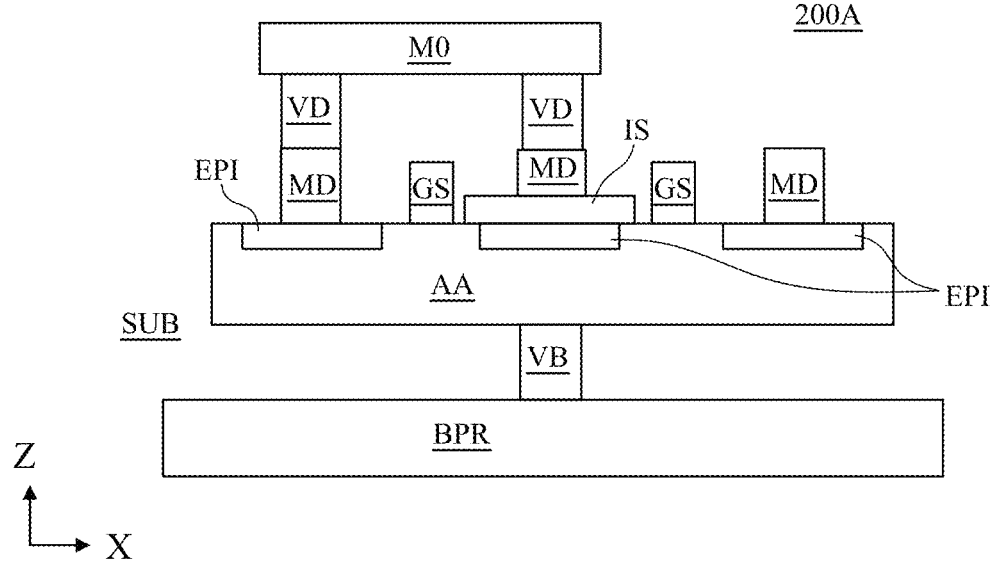
Figure 2C:
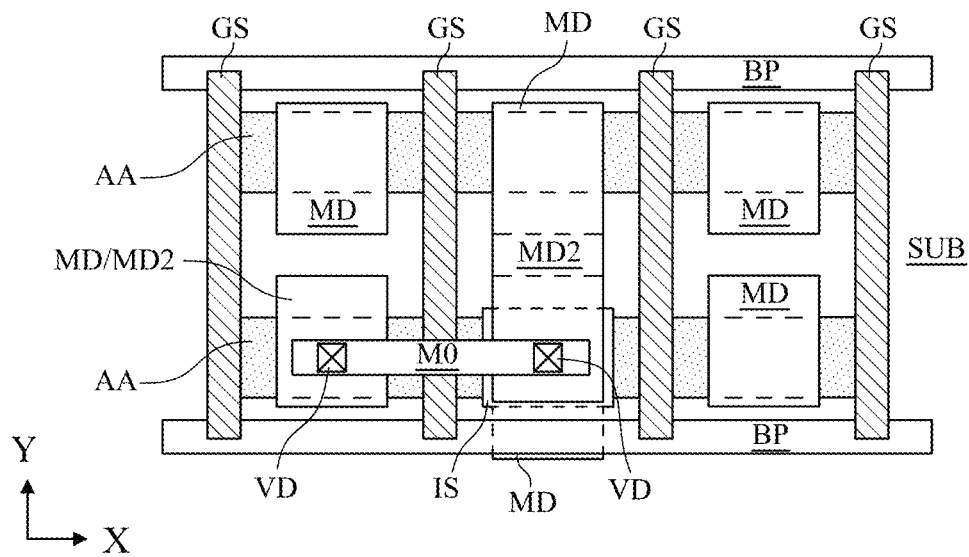
FIGS. 2C and 2D are diagrams of an IC layout diagram and corresponding IC structure, in accordance with some embodiments.
Figure 2D:
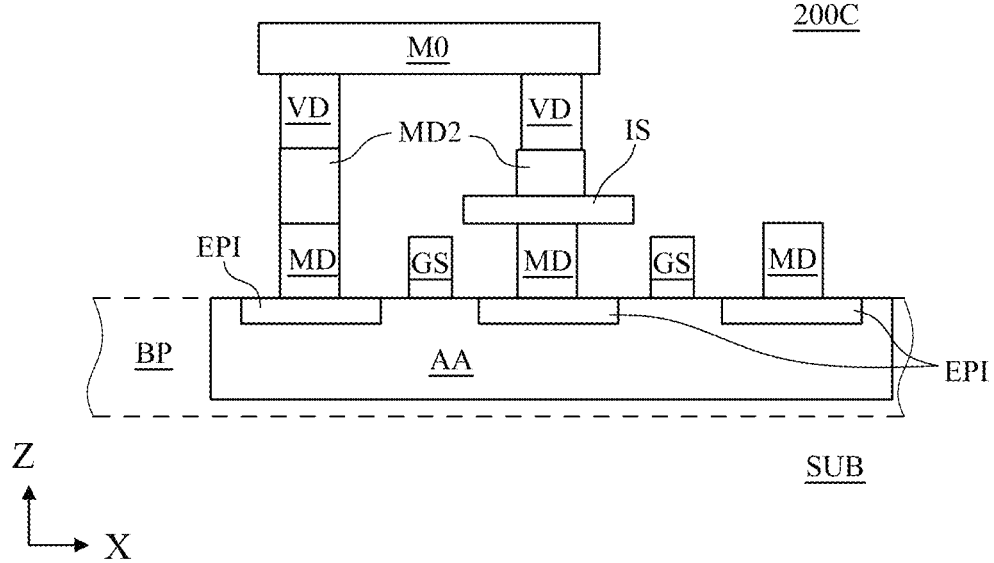
Figure 3A:
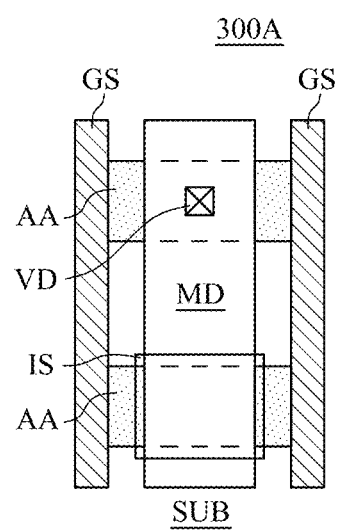
FIGS. 3A-3C are diagrams of IC layout diagrams and corresponding IC structures, in accordance with some embodiments.
Figure 3B:
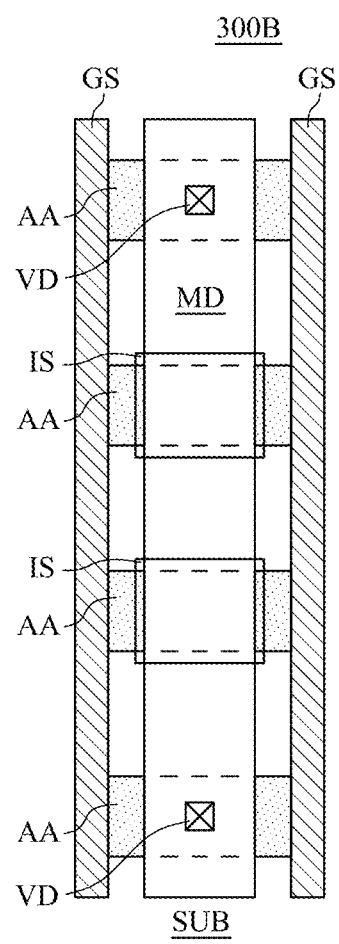
Figure 3C:
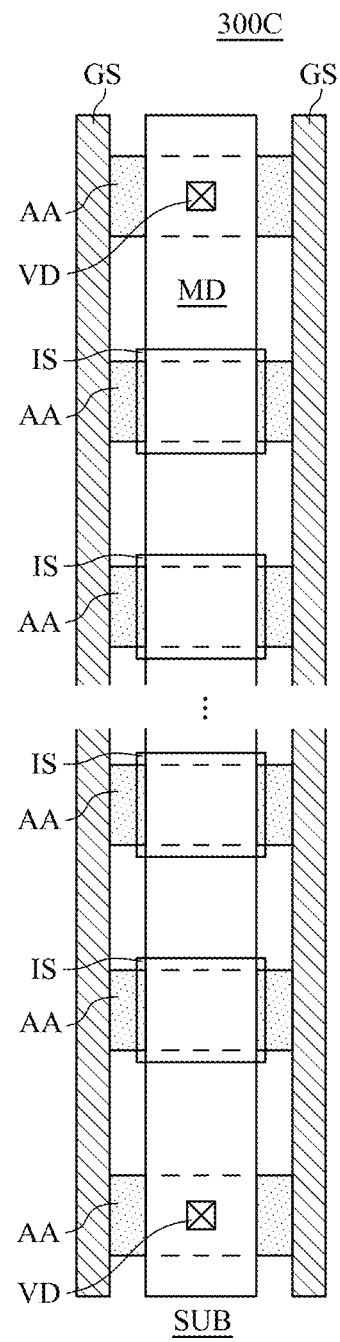

FIGS. 2A and 2B depict respective plan and cross-sectional views of IC layout/structure 200A, in accordance with some embodiments, and FIGS. 2C and 2D depict respective plan and cross-sectional views of IC layout/structure 200C, in accordance with some embodiments. IC layout/structure 200A corresponds to a manufacturing process including a single MD layer, and IC layout/structure 200C corresponds to a manufacturing process including two MD layers.

Each of IC layouts/structures 200A and 200C includes two instances of active region/area AA extending in the X direction and four instances of gate regions/structure GS extending in the Y direction, each instance of gate region/structure GS overlapping/overlying each instance of active region/area AA. Each of IC layouts/structures 200A and 200C also includes isolation region/structure IS overlapping/overlying a first instance of active region/area AA, a via region/structure VD overlapping/overlying isolation region/structure IS and the first instance of active region/area AA, a via region/structure VD overlapping/overlying the first instance of active region/area AA, and a metal region/structure MO extending in the X direction and overlapping/overlying each instance of via region/structure VD.

In the embodiments depicted in FIGS. 2B and 2D, active region/area AA includes instances of epitaxial layer EPI corresponding to S/D structures at locations at which instances of MD region/segment MD overlap/overlie active region/area AA. In some embodiments, active region/area AA does not include instances of epitaxial layer EPI corresponding to S/D structures at some or all of the locations at which instances of MD region/segment MD overlap/overlie active region/area AA.

IC layout/structure 200A also includes backside power rails BPR and via region/structure VB configured as discussed above with respect to FIG. 1D, and IC layout/structure 200C also includes buried power rails BP and an instance of MD region/structure MD configured as discussed above with respect to FIG. 1E. FIG. 2D includes a dashed line to indicate that buried power rail BP is in a cross-sectional plane other than the cross-section plane of the other features of IC layout-structure 100C. Each of IC layouts/structures 200A and 200C is thereby configured to include an electrical path between a corresponding power rail and a first portion of the first active area AA underlying isolation structure IS.

As depicted in FIGS. 2A and 2B, a first instance of MD region/segment MD overlaps/overlies isolation region/structure IS and the first portion of the first instance of active region/area AA, extends in the Y direction between two instances of gate region/structure GS, and overlaps/overlies a corresponding portion of the second instance of active region/area AA. A second instance of MD region/structure MD overlaps/overlies a second portion of the first instance of active region/area AA.

The first and second instances of MD regions/segments MD, two instances of via regions/structure VD, and metal region/structure MO are thereby configured as an electrical path between the second portion of the first instance of active region/area AA and the portion of the second instance of active region/area AA, the electrical path being separate from the electrical path between the first portion of the first instance of active region/area AA and power rail BPR.

As depicted in FIGS. 2C and 2D, a first instance of MD region/segment MD2 overlaps/overlies isolation region/structure IS, a first instance of MD region/segment MD, and the first portion of the first instance of active region/area AA, extends in the Y direction between two instances of gate region/structure GS, and overlaps/overlies a corresponding portion of the second instance of active region/area AA. A second instance of MD region/structure MD2 overlaps/overlies a second instance of MD region/segment MD and a second portion of the first instance of active region/area AA.

The second instance of MD region/segment MD, the first and second instances of MD regions/segments MD2, two instances of via regions/structure VD, and metal region/structure MO are thereby configured as an electrical path between the second portion of the first instance of active region/area AA and the portion of the second instance of active region/area AA, the electrical path being separate from the electrical path between the first portion of the first instance of active region/area AA and buried power rail BP.

By including the electrical path including the corresponding MD region/segment MD or MD2 separate from the electrical connection to the corresponding power rail BPR or PB, a circuit that includes one of IC layouts/structures 200A or 200C is thereby capable of reducing the use of metal segments in electrical paths whereby the benefits discussed above with respect to IC layouts/structures 100B and 100C are obtained.

FIGS. 3A-3C depict plan views of respective IC layouts/structures 300A-300C, in accordance with some embodiments. Each of IC layouts/structures 300A-300C includes MD region/segment MD extending in the Y direction between instances of gate regions/structures GS. In embodiments in which a manufacturing process includes a single MD layer, MD region/segment MD corresponds to an instance of MD region segment MD discussed above with respect to FIGS. 1B, 1D, 2A, and 2B. In embodiments in which a manufacturing process includes two MD layers, MD region/segment MD corresponds to an instance of MD region segment MD2 discussed above with respect to FIGS. 1C, 1E, 2C, and 2D.

IC layout/structure 300A also includes two instances of active region/area AA, an instance of isolation region/structure IS, and an instance of via region/structure VD. MD region/segment MD and the instance of via region/structure VD are thereby configured as an electrical path separate from the portion of the instance of active region/area AA underlying the instance of isolation region/structure IS.

IC layout/structure 300B also includes four instances of active region/area AA, two instances of isolation region/structure IS, and two instances of via region/structure VD. MD region/segment MD and the two instances of via region/structure VD are thereby configured as an electrical path separate from the portions of the two instances of active region/area AA underlying the two instances of isolation region/structure IS.

IC layout/structure 300C also includes at least six instances of active region/area AA, at least four instances of isolation region/structure IS, and two instances of via region/structure VD. MD region/segment MD and the two instances of via region/structure VD are thereby configured as an electrical path separate from the portions of the at least four instances of active region/area AA underlying the at least four instances of isolation region/structure IS.

As illustrated in each of FIGS. 3A-3C, each instance of isolation region/structure IS extends in the X direction further than MD region/segment MD, and thereby has a dimension in the X direction greater than a dimension of MD region/segment MD in the X direction. Each instance of isolation region/structure IS also extends in the Y direction further than each underlying instance of active region/area AA, and thereby has a dimension in the Y direction greater than a dimension of the corresponding active region/area AA in the Y direction.

By including the electrical path including the corresponding MD region/segment MD separate from the underlying instance or instances of active region/area AA, a circuit that includes one of IC layouts/structures 300A-300C is thereby capable of reducing the use of metal segments in electrical paths whereby the benefits discussed above with respect to IC layouts/structures 100B and 100C are obtained.

FIGS. 4-7 depict plan views of respective IC layouts/devices 400-700, in accordance with some embodiments. As discussed below, each of IC layouts/devices 400-700 is configured as a scan D flip-flop circuit including instances of isolation region/structure IS in accordance with one or more of the embodiments discussed above with respect to FIGS. 1A-3C. Each of IC layout/devices 400 and 500 corresponds to a manufacturing process including a single MD layer, and each of IC layout/devices 600 and 700 corresponds to a manufacturing process including two MD layers.

Each of IC layouts/devices 400-700 includes active regions/areas AA1-AA4 extending in the X direction, pluralities of MD regions/segments D1-D13 or D1-D12 extending in the Y direction and overlapping/overlying active regions/areas AA1-AA4, and pluralities of gate regions/structures G1-G14 or G1-G13 extending in the Y direction and overlapping/overlying active regions/areas AA1-AA4. Each of active regions/areas AA1 and AA4 is a p-type active region/area corresponding to PMOS transistors, and each of active regions/areas AA2 and AA3 is an n-type active region/area corresponding to NMOS transistors.

Each plurality of gate regions/structures of pluralities of gate regions/structures G1-G14 includes from one to three gate regions/structures (not individually labeled) aligned in the Y direction and electrically separated in accordance with cut gate regions that are not depicted for the purpose of clarity. Each plurality of MD regions/segments of pluralities of MD regions/segments D1-D13 includes from one to four MD regions/segments MD (not individually labeled) aligned in the Y direction and electrically separated in accordance with cut MD regions that are not depicted for the purpose of clarity.

Figure 6:
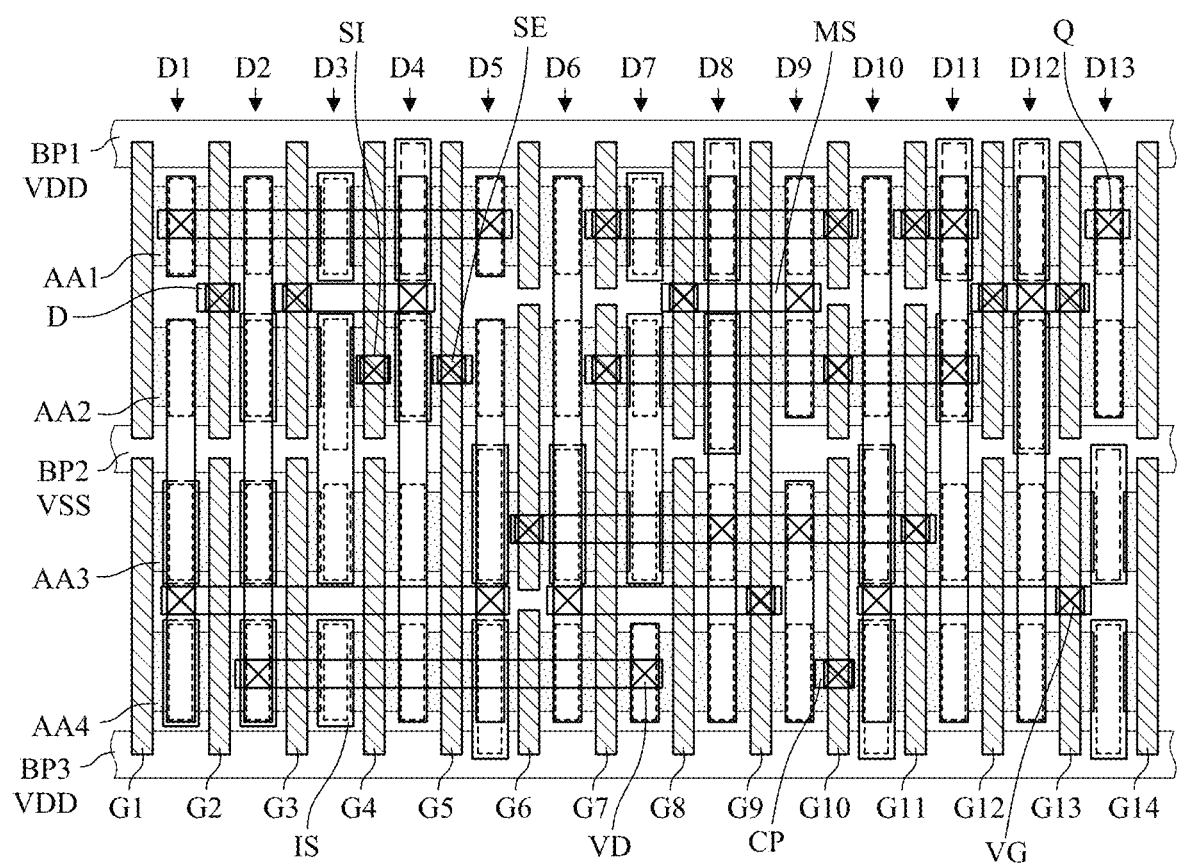
FIG. 6 is a diagram of a plan view of an IC layout diagram and corresponding IC device, in accordance with some embodiments.
Figure 7:
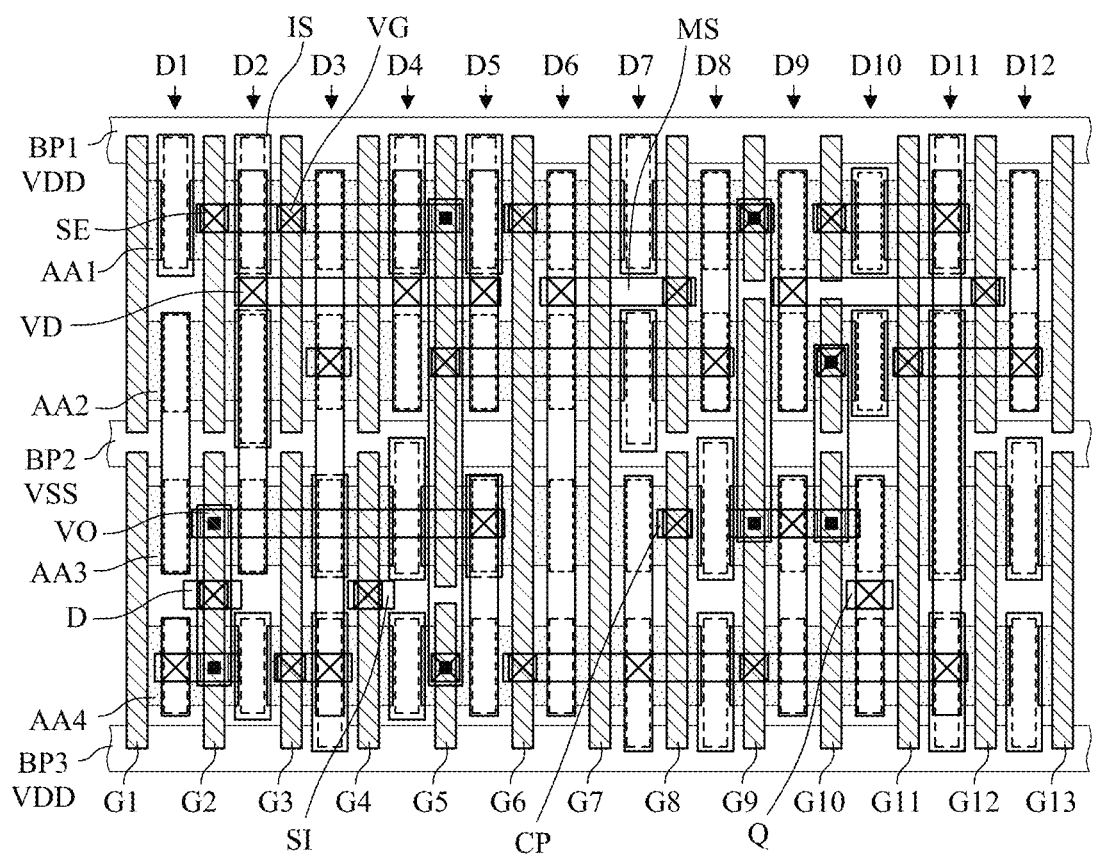
FIG. 7 is a diagram of a plan view of an IC layout diagram and corresponding IC device, in accordance with some embodiments.
Figure 7:
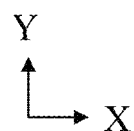

In IC layouts/devices 600 and 700, each plurality of MD regions/segments of pluralities of MD regions/segments D1-D13 also includes from one to three MD regions/segments MD2 (not individually labeled) aligned in the Y direction and electrically separated in accordance with cut MD2 regions that are not depicted for the purpose of clarity. In FIGS. 6 and 7, MD regions/segments MD2 are represented by solid borders and MD regions/segments MD are represented by dashed borders.

Each of IC layouts/devices 400-700 also includes instances of each of via regions/structures VD and VG and metal regions/segments MS extending in the X direction in the first metal layer. In each of FIGS. 4-7, a single one of each of via regions/structures VD and VG and metal regions/segments MS is labeled for the purpose of clarity. Each instance of via regions/structures VD and VG represents an electrical connection between a corresponding underlying MD segment MD/MD2 or gate structure G1-G14 and an overlying metal segment MS extending in the X direction.

Each of IC layouts/devices 500 and 700 also includes instances of each of via regions/structures V0 (a single one labeled for the purpose of clarity) and metal regions/segments MS extending in the Y direction in the second metal layer. Each instance of via regions/structures V0 represents an electrical connection between a corresponding underlying metal segment MS extending in the X direction and an overlying metal segment MS extending in the Y direction.

Figure 4:
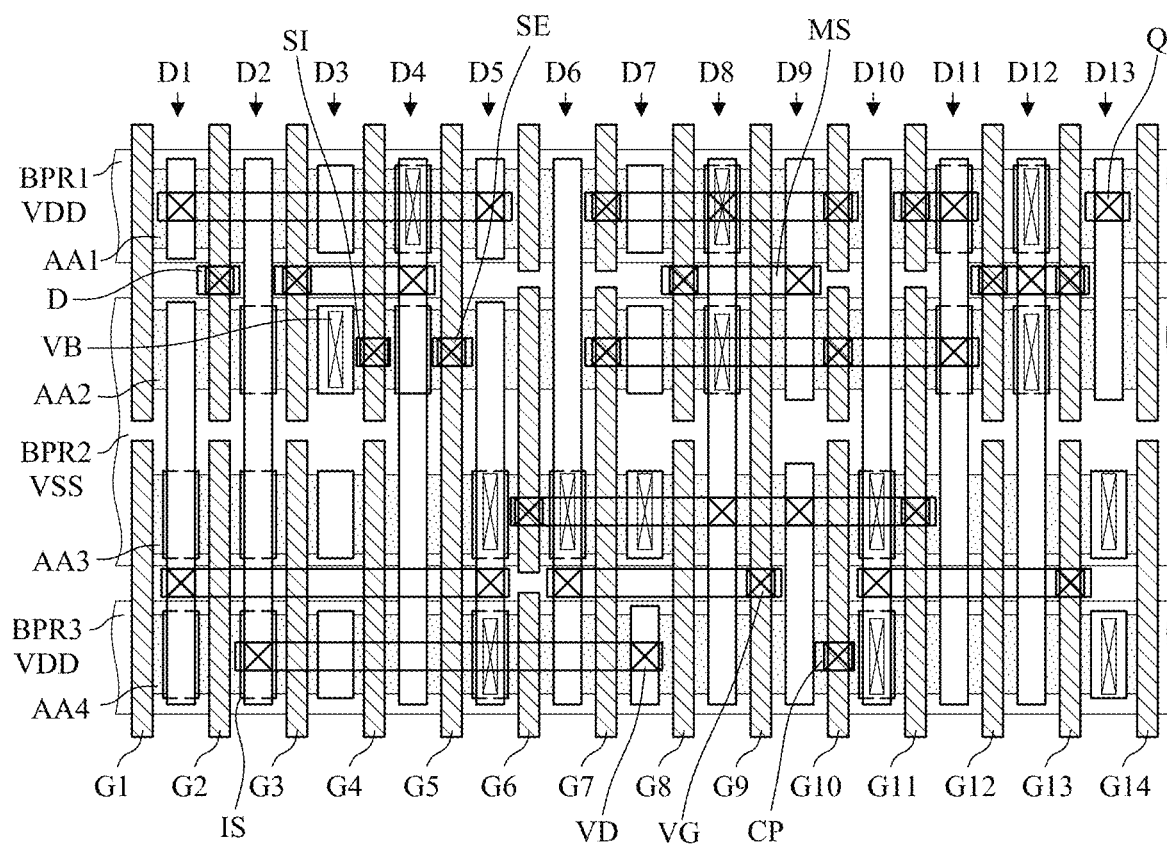
FIG. 4 is a diagram of a plan view of an IC layout diagram and corresponding IC device, in accordance with some embodiments.
Figure 5:
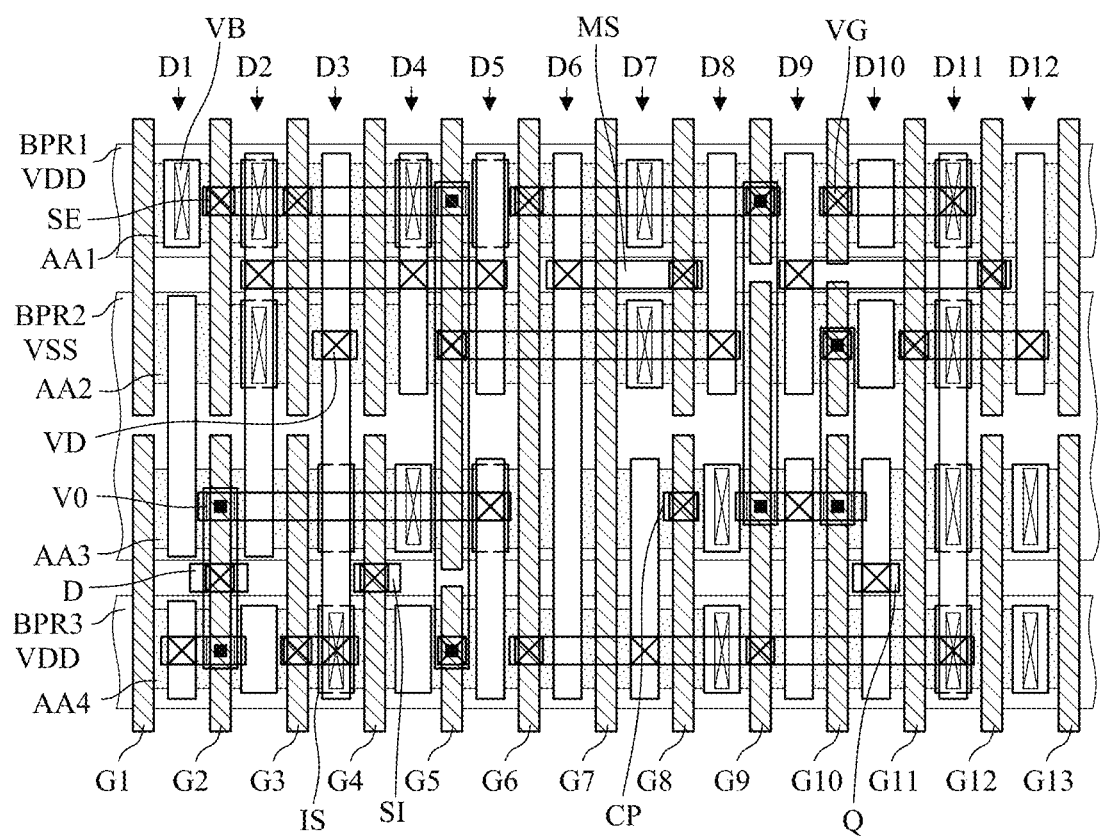
FIG. 5 is a diagram of a plan view of an IC layout diagram and corresponding IC device, in accordance with some embodiments.

As depicted in FIGS. 4 and 5, each of IC layouts/devices 400 and 500 includes backside power rail BPR1 electrically connected to active region/area AA1 through instances of via regions/structures VB (a single one labeled for the purpose of clarity), backside power rail BPR2 electrically connected to each of active regions/areas AA2 and AA3 through instances of via regions/structures VB, and backside power rail BPR3 electrically connected to active region/area AA4 through instances of via regions/structures VB. Each of backside power rails BPR1 and BPR3 is configured to carry power supply voltage VDD, and backside power rail BPR2 is configured to carry power supply reference voltage VSS.

As depicted in FIGS. 6 and 7, each of IC layouts/devices 600 and 700 includes buried power rail BP1 electrically connected to active region/area AA1 through instances of MD regions/segments MD, buried power rail BP2 electrically connected to each of active regions/areas AA2 and AA3 through instances of MD regions/segments MD, and buried power rail BP3 electrically connected to active region/area AA4 through instances of MD regions/segments MD. Each of buried power rails BP1 and BP3 is configured to carry power supply voltage VDD, and buried power rail BP2 is configured to carry power supply reference voltage VSS.

As depicted in FIGS. 4-7, the referenced features of each of IC layouts/devices 400-700 are configured as a scan D flip-flop circuit including instances of metal regions/segments MS arranged as input terminals configured to receive a signal D (also referred to as a data signal in some embodiments), a signal SI (also referred to as a scan test signal in some embodiments), a signal SE (also referred to as an enable signal in some embodiments), and a signal CP (also referred to as a clock signal in some embodiments). Each of IC layouts/devices 400-700 is configured as depicted in FIGS. 4-7 to generate a signal Q (also referred to as an output signal in some embodiments) based on signals D, SI, SE, and CP, and includes an instance of metal regions/segments MS arranged as an output terminal configured to output signal Q.

As depicted in FIGS. 4-7, each of IC layouts/devices 400-700 includes instances of isolation region/structure IS (a single one labeled for the purpose of clarity). In each of IC layouts/devices 400 and 500, various instances of isolation region/structure IS are positioned between active regions/areas AA1-AA4 and corresponding MD regions/segments MD, and in each of IC layouts/devices 400 and 500, various instances of isolation region/structure IS are positioned between corresponding MD regions/segments MD and MD regions/segments MD2.

As depicted in FIG. 4, IC layout/device 400 includes an MD region/segment MD overlying an instance of isolation region/structure IS and thereby configured as a separated electrical path (also referred to as a fly connection in some embodiments), as discussed above, in each of pluralities of MD regions/segments D1, D2, D4-D6, D8, and D10-D12.

As depicted in FIG. 5, IC layout/device 500 includes an MD region/segment MD overlying an instance of isolation region/structure IS and thereby configured as a separated electrical path, as discussed above, in each of pluralities of MD regions/segments D3, D5, and D11.

As depicted in FIG. 6, IC layout/device 600 includes an MD region/segment MD2 overlying an instance of isolation region/structure IS and thereby configured as a separated electrical path, as discussed above, in each of pluralities of MD regions/segments D1, D2, D4-D6, D8, and D10-D12.

As depicted in FIG. 7, IC layout/device 700 includes an MD region/segment MD2 overlying an instance of isolation region/structure IS and thereby configured as a separated electrical path, as discussed above, in each of pluralities of MD regions/segments D3, D5, and D11.

Each of IC layouts/devices 400 and 600 thereby includes a total of 14 pluralities of gate regions/structures G1-G14 and a total of four active regions/areas AA1-AA4 corresponding to a total gate pitch (also referred to as a poly pitch in some embodiments) of 26, and is free from including instances of metal regions/segments MS extending in the Y direction in the second metal layer.

Each of IC layouts/devices 500 and 700 thereby includes a total of 13 pluralities of gate regions/structures G1-G13 and a total of four active regions/areas AA1-AA4 corresponding to a total gate pitch of 24, and includes four instances of metal regions/segments MS extending in the Y direction in the second metal layer. Compared to IC layouts/devices 400 and 600, IC layouts/devices 500 and 700 have smaller areas and potentially higher costs based on including the instances of metal regions/segments MS in the second metal layer.

By the configurations discussed above, each of IC layouts 400-700 includes electrical paths including the corresponding MD regions/segments MD or MD2 separate from the corresponding underlying ones of active regions/areas AA1-AA4 and is thereby capable of reducing the use of metal segments in electrical paths whereby the benefits discussed above with respect to IC layouts/structures 100B-300C are obtained.

Figure 8:
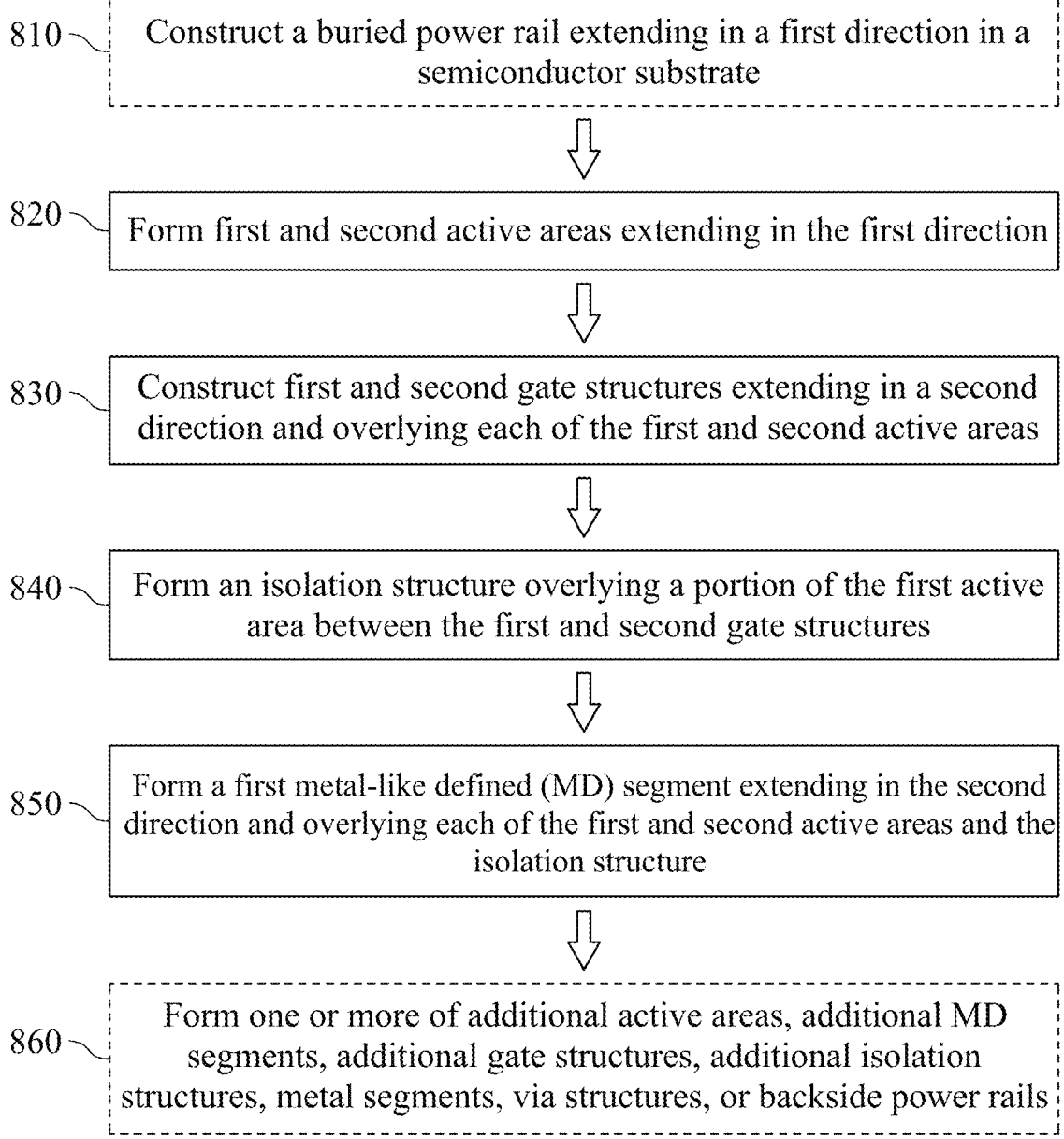
FIG. 8 is a flowchart of a method of manufacturing an IC structure, in accordance with some embodiments.

FIG. 8 is a flowchart of a method 800 of manufacturing an IC structure, in accordance with some embodiments. Method 800 is operable to form one or more of IC structures 100A-100E, 200A, 200C, 300A-300C, or IC devices 400-700 discussed above with respect to FIGS. 1A-7.

In some embodiments, the operations of method 800 are performed in the order depicted in FIG. 8. In some embodiments, the operations of method 800 are performed in an order other than the order depicted in FIG. 8. In some embodiments, one or more additional operations are performed before, during, and/or after the operations of method 800. In some embodiments, performing some or all of the operations of method 800 includes performing one or more operations as discussed below with respect to IC manufacturing system 1000 and FIG. 10.

At operation 810, in some embodiments, a buried power rail extending in a first direction in a semiconductor substrate is constructed. In some embodiments, constructing the buried power rail includes constructing one or more instances of power rail BP discussed above with respect to FIGS. 1E, 2C, and 2D, or constructing power rails BP1-BP3 discussed above with respect to FIGS. 6 and 7.

In some embodiments, forming a metal segment, e.g., a buried or backside power rail, includes performing a plurality of manufacturing operations including depositing and patterning one or more photoresist layers, performing one or more etching processes, and performing one or more deposition processes whereby one or more conductive materials are configured to form a continuous, low resistance structure.

At operation 820, first and second active areas extending in the first direction in the semiconductor substrate are formed. In some embodiments, forming the first and second active areas includes forming two or more instances of active area AA discussed above with respect to FIGS. 1A-3C. In some embodiments, forming the first and second active areas includes forming active areas AA1-AA4 discussed above with respect to FIGS. 4-7.

In some embodiments, forming the first and second active areas includes forming one or more MD segments overlying and electrically connected to one or each of the first and second active areas as part of a two MD layer manufacturing process. In some embodiments, forming the one or more MD segments includes forming an MD segment overlying and electrically connected to a buried power rail. In some embodiments, forming the one or more MD segments includes forming one or more instances of MD segment MD as discussed above with respect to FIGS. 1C, 1E, 2C-3C, 6, and 7.

In some embodiments, forming the first and second active areas includes performing one or more implantation processes in areas of a semiconductor substrate corresponding to the first and second active areas, whereby predetermined doping concentrations and types are achieved for one or more given dopants as discussed above. In some embodiments, forming the first and second active areas includes performing one or more implantation, deposition, or other processes suitable for forming an MD segment having a low resistance as discussed above.

In some embodiments, forming the first and second active areas includes forming a plurality of S/D structures in and/or on some or all of the active areas of the corresponding active areas, e.g., by performing one or more implantation processes and/or one or more deposition processes.

At operation 830, first and second gate structures extending in a second direction and overlying each of the first and second active areas are constructed. In some embodiments, constructing the first and second gate structures includes constructing gates A1 and A2 discussed above with respect to FIGS. 1A-1C. In some embodiments, constructing the first and second gate structures includes constructing two or more instances of gate structure GS discussed above with respect to FIGS. 2A-3C. In some embodiments, constructing the first and second gate structures includes constructing pluralities of gate structures G1-G14 discussed above with respect to FIGS. 4-7.

In some embodiments, constructing the first and second gate structures includes performing a plurality of manufacturing operations, e.g., one or more of a lithography, diffusion, deposition, etching, planarizing, or other operation suitable for constructing the first and second gate structures as discussed above.

At operation 840, an isolation structure overlying a portion of the first active area between the first and second gate structures is formed. In some embodiments, forming the isolation structure includes forming one or more instances of isolation structure IS discussed above with respect to FIGS. 1A-7.

In some embodiments, forming the isolation structure overlying the portion of the first active area between the first and second gate structures includes overlying one or more instances of active area AA between gate structures A1 and A2 or GS as discussed above with respect to FIGS. 1A-3C and/or one or more of active areas AA1-AA4 between two gate structures of pluralities of gate structures G1-G14 discussed above with respect to FIGS. 4-7.

In some embodiments, forming the isolation structure overlying the portion of the first active area includes forming one or more instances of isolation structure IS overlying one or more instances of MD segment MD as discussed above with respect to FIGS. 1C, 1E, 2C-3C, 6, and 7.

In some embodiments, forming the isolation structure includes performing a plurality of manufacturing operations including depositing and patterning one or more photoresist layers, performing one or more etching processes, and performing one or more deposition processes whereby one or more insulating materials are configured to form a continuous, high resistance volume as discussed above.

At operation 850, a first MD segment extending in the second direction and overlying each of the first and second active areas and the isolation structure is formed. The first MD segment is electrically connected to the second active area and electrically isolated from the portion of the first active area between the first and second gate structures.

In some embodiments, forming the first MD segment includes forming one or more instances of MD segment MD as discussed above with respect to FIGS. 1B, 1D, 2A, 2B, 3A-4, and 5. In some embodiments, forming the first MD segment includes forming one or more instances of MD segment MD2 as discussed above with respect to FIGS. 1C, 1E, 2C-3A, 6, and 7.

In some embodiments, forming the first MD segment includes forming the first MD segment as part of an electrical path, e.g., between multiple instances of active area AA as discussed above with respect to FIGS. 1A-1E and 3A-3C.

In some embodiments, forming the first MD segment overlying each of the first and second active areas includes forming the first MD segment overlying more than two instances of active area AA as discussed above with respect to FIGS. 3A-3C.

In some embodiments, forming the first MD segment includes performing one or more implantation, deposition, or other processes suitable for forming an MD segment having a low resistance as discussed above.

At operation 860, in some embodiments, one or more of additional active areas, additional MD segments, additional gate structures, additional isolation structures, metal segments, via structures, or backside power rails are formed.

In some embodiments, forming one or more via structures or backside power rails includes forming a via structure extending from the portion of the first active area between the first and second gate structures to a back side of the semiconductor substrate and constructing a power rail in the back side of the semiconductor substrate electrically connected to the via structure. In some embodiments, forming one or more via structures or backside power rails includes forming one or more via structures VB and one or more power rails BPR or BPR1-BPR3 as discussed above with respect to FIGS. 1D, 2A, 2B, 4, and 5.

In some embodiments, forming one or more additional MD segments, via structures, or metal segments includes forming a second MD segment overlying and electrically connected to the first active area, the first gate structure being positioned between the first and second MD segments, and constructing a metal segment overlying each of the first and a second MD segments, the first gate structure, and the isolation structure, the metal segment and the first MD segment being configured to electrically connect the second MD segment to a portion of the second active area between the first and second gate structures. In some embodiments, forming one or more additional MD segments, via structures, or metal segments includes forming one or more instances of MD segment MD or MD2, two or more instances of via structure VD, and one or more instances of metal segment MO as discussed above with respect to FIGS. 2A-2D.

In some embodiments, forming the one or more of additional active areas, additional MD segments, additional gate structures, additional isolation structures, metal segments, via structures, or backside power rails includes forming a circuit, e.g., one of IC devices 400-700 discussed above with respect to FIGS. 4-7.

In some embodiments, forming the one or more of additional active areas, additional MD segments, additional gate structures, additional isolation structures, metal segments, via structures, or backside power rails is part of building a plurality of IC devices, e.g., transistors, logic gates, memory cells, interconnect structures, and/or other suitable devices, by performing a plurality of manufacturing operations, e.g., one or more of a lithography, diffusion, deposition, etching, planarizing, or other operation suitable for building the plurality of IC devices in the semiconductor substrate.

By performing some or all of the operations of method 800, an IC structure is manufactured in which an electrical path includes an MD segment and is separate from a shared S/D structure of a transistor series or a power rail connection, thereby obtaining the benefits discussed above with respect to IC structures 100A-100E, 200A, 200C, and 300A-300C, and IC devices 400-700.

Figure 9:
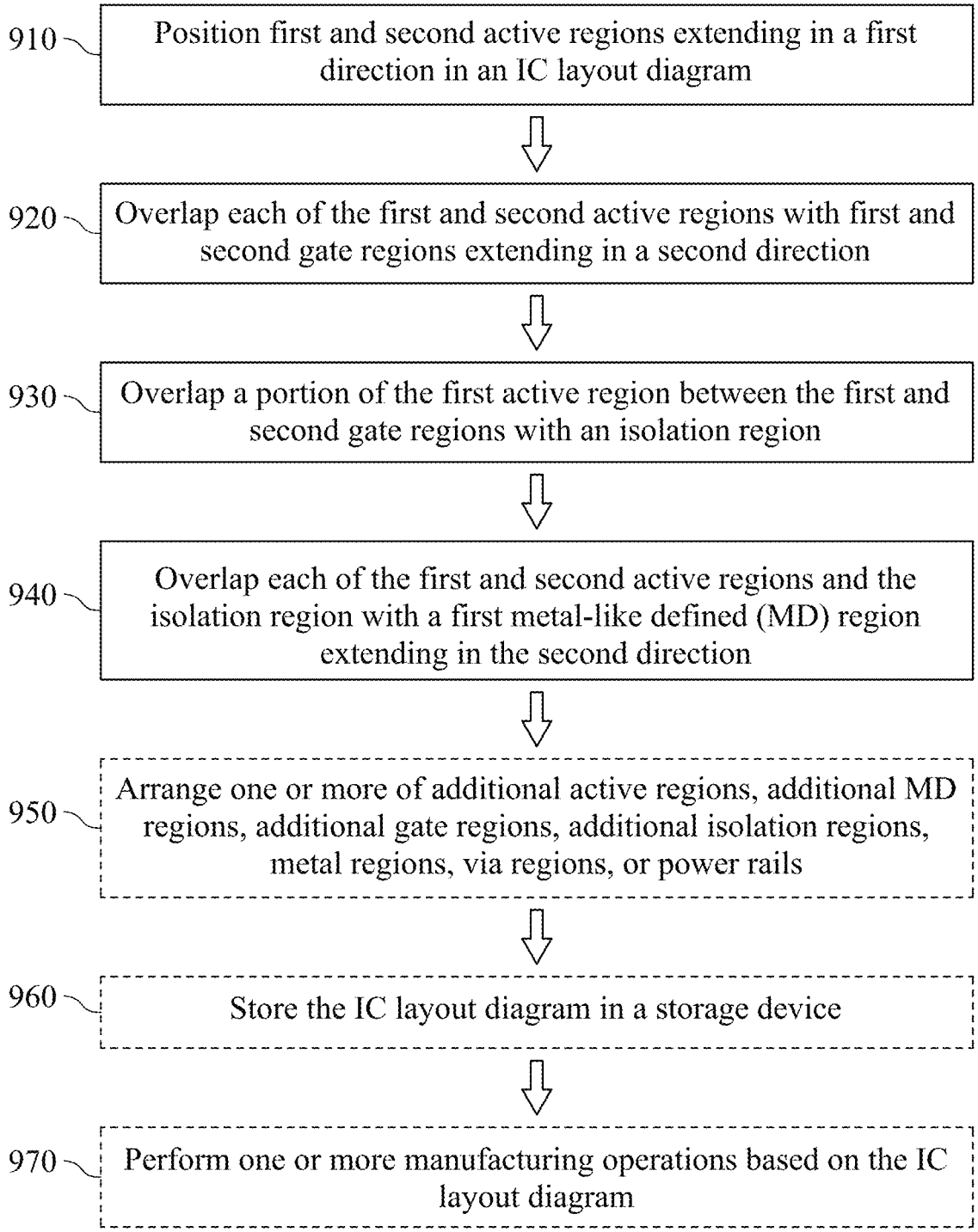
FIG. 9 is a flowchart of a method of generating an IC layout diagram, in accordance with some embodiments.

FIG. 9 is a flowchart of a method 900 of generating an IC layout diagram, e.g., an IC layout diagram 100A-100E, 200A, 200C, 300A-300C, or 400-700 discussed above with respect to FIGS. 1A-7, in accordance with some embodiments.

In some embodiments, generating the IC layout diagram includes generating the IC layout diagram corresponding to an IC structure or device, e.g., an IC structure 100A-100E, 200A, 200C, 300A-300C, or device 400-700 discussed above with respect to FIGS. 1A-7, manufactured based on the generated IC layout diagram.

In some embodiments, some or all of method 900 is executed by a processor of a computer, e.g., a processor 1002 of an IC layout diagram generation system 1000, discussed below with respect to FIG. 10.

Some or all of the operations of method 900 are capable of being performed as part of a design procedure performed in a design house, e.g., a design house 1120 discussed below with respect to FIG. 11.

In some embodiments, the operations of method 900 are performed in the order depicted in FIG. 9. In some embodiments, the operations of method 900 are performed simultaneously and/or in an order other than the order depicted in FIG. 9. In some embodiments, one or more operations are performed before, between, during, and/or after performing one or more operations of method 900.

At operation 910, first and second active regions extending in a first direction are positioned in an IC layout diagram. In some embodiments, positioning the first and second active regions includes positioning two or more instances of active region AA discussed above with respect to FIGS. 1A-3C. In some embodiments, positioning the first and second active regions includes positioning active regions AA1-AA4 discussed above with respect to FIGS. 4-7.

In some embodiments, positioning the first and second active regions includes positioning one or more MD regions overlapping one or each of the first and second active regions as part of a two MD layer manufacturing process. In some embodiments, positioning the one or more MD regions includes positioning an MD region overlapping a buried power rail. In some embodiments, positioning the one or more MD regions includes positioning one or more instances of MD region MD as discussed above with respect to FIGS. 1C, 1E, 2C-3C, 6, and 7.

At operation 920, each of the first and second active regions is overlapped with first and second gate regions extending in a second direction. In some embodiments, overlapping the first and second active regions with first and second gate regions includes overlapping active regions AA with gate regions A1 and A2 discussed above with respect to FIGS. 1A-1C. In some embodiments, overlapping the first and second active regions with first and second gate regions includes overlapping active regions AA with two or more instances of gate region GS discussed above with respect to FIGS. 2A-3C. In some embodiments, overlapping the first and second active regions with first and second gate regions includes overlapping two of gate regions AA1-AA4 with pluralities of gate structures G1-G14 discussed above with respect to FIGS. 4-7.

At operation 930, a portion of the first active region between the first and second gate regions is overlapped with an isolation region. In some embodiments, overlapping the portion of the first active region between the first and second gate regions with the isolation region includes positioning one or more instances of isolation region IS discussed above with respect to FIGS. 1A-7.

In some embodiments, overlapping the portion of the first active region between the first and second gate regions with the isolation region includes overlapping one or more instances of active region AA between gate regions A1 and A2 or GS as discussed above with respect to FIGS. 1A-3C and/or one or more of active regions AA1-AA4 between two gate regions of pluralities of gate regions G1-G14 discussed above with respect to FIGS. 4-7.

In some embodiments, overlapping the portion of the first active region between the first and second gate regions with the isolation region includes positioning one or more instances of isolation region IS overlapping one or more instances of MD region MD as discussed above with respect to FIGS. 1C, 1E, 2C-3C, 6, and 7.

At operation 940, each of the first and second active regions and the isolation region is overlapped with a first MD region extending in the second direction. The first MD region is configured to form an electrical connection to the second active region and be electrically isolated from the portion of the first active region between the first and second gate regions.

In some embodiments, overlapping each of the first and second active regions and the isolation region with the first MD region includes overlapping instances of active region AA with one or more instances of MD region MD as discussed above with respect to FIGS. 1B, 1D, 2A, 2B, 3A-4, and 5. In some embodiments, overlapping each of the first and second active regions and the isolation region with the first MD region includes overlapping instances of active region AA or AA1-AA4 with one or more instances of MD region MD2 as discussed above with respect to FIGS. 1C, 1E, 2C-3A, 6, and 7.

In some embodiments, overlapping each of the first and second active regions and the isolation region with the first MD region includes positioning the first MD region as part of an electrical path, e.g., between multiple instances of active region AA as discussed above with respect to FIGS. 1A-1E and 3A-3C.

In some embodiments, overlapping each of the first and second active regions and the isolation region with the first MD region includes positioning the first MD region overlapping more than two instances of active region AA as discussed above with respect to FIGS. 3A-3C.

At operation 950, in some embodiments, one or more of additional active regions, additional MD regions, additional gate regions, additional isolation regions, metal regions, via regions, or power rails are arranged.

In some embodiments, arranging one or more additional MD regions or power rails includes positioning a buried power rail extending in the first direction. In some embodiments, positioning the buried power rail includes positioning one or more instances of power rail BP discussed above with respect to FIGS. 1E, 2C, and 2D, or positioning power rails BP1-BP3 discussed above with respect to FIGS. 6 and 7.

In some embodiments, arranging one or more additional via regions or power rails includes positioning a via region extending from the portion of the first active region between the first and second gate region to a back side of the semiconductor substrate and positioning a power rail in the back side of the semiconductor substrate electrically connected to the via region. In some embodiments, positioning one or more via regions or backside power rails includes positioning one or more via regions VB and one or more power rails BPR or BPR1-BPR3 as discussed above with respect to FIGS. 1D, 2A, 2B, 4, and 5.

In some embodiments, arranging one or more additional MD regions, via regions, or metal regions includes positioning a second MD region overlapping the first active region, the first gate region being positioned between the first and second MD regions, and positioning a metal region overlapping each of the first and a second MD region, the first gate region, and the isolation region, the metal region and the first MD region being configured to electrically connect the second MD region to a portion of the second active region between the first and second gate regions. In some embodiments, arranging one or more additional MD regions, via regions, or metal regions includes positioning one or more instances of MD region MD or MD2, two or more instances of via region VD, and one or more instances of metal region MO as discussed above with respect to FIGS. 2A-2D.

In some embodiments, arranging one or more of additional active regions, additional MD regions, additional gate regions, additional isolation regions, metal regions, via regions, or power rails includes forming a circuit, e.g., one of IC devices 400-700 discussed above with respect to FIGS. 4-7.

At operation 960, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram in layout library 1007 or over network 1014 of IC layout diagram generation system 1000, discussed below with respect to FIG. 10.

At operation 970, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed above with respect to FIG. 8 and below with respect to FIG. 11.

By executing some or all of the operations of method 900, an IC layout diagram is generated corresponding to an IC structure in which an electrical path includes an MD segment and is separate from a shared S/D structure of a transistor series or a power rail connection, thereby obtaining the benefits discussed above with respect to IC structures 100A-100E, 200A, 200C, and 300A-300C, and IC devices 400-700.

Figure 10:
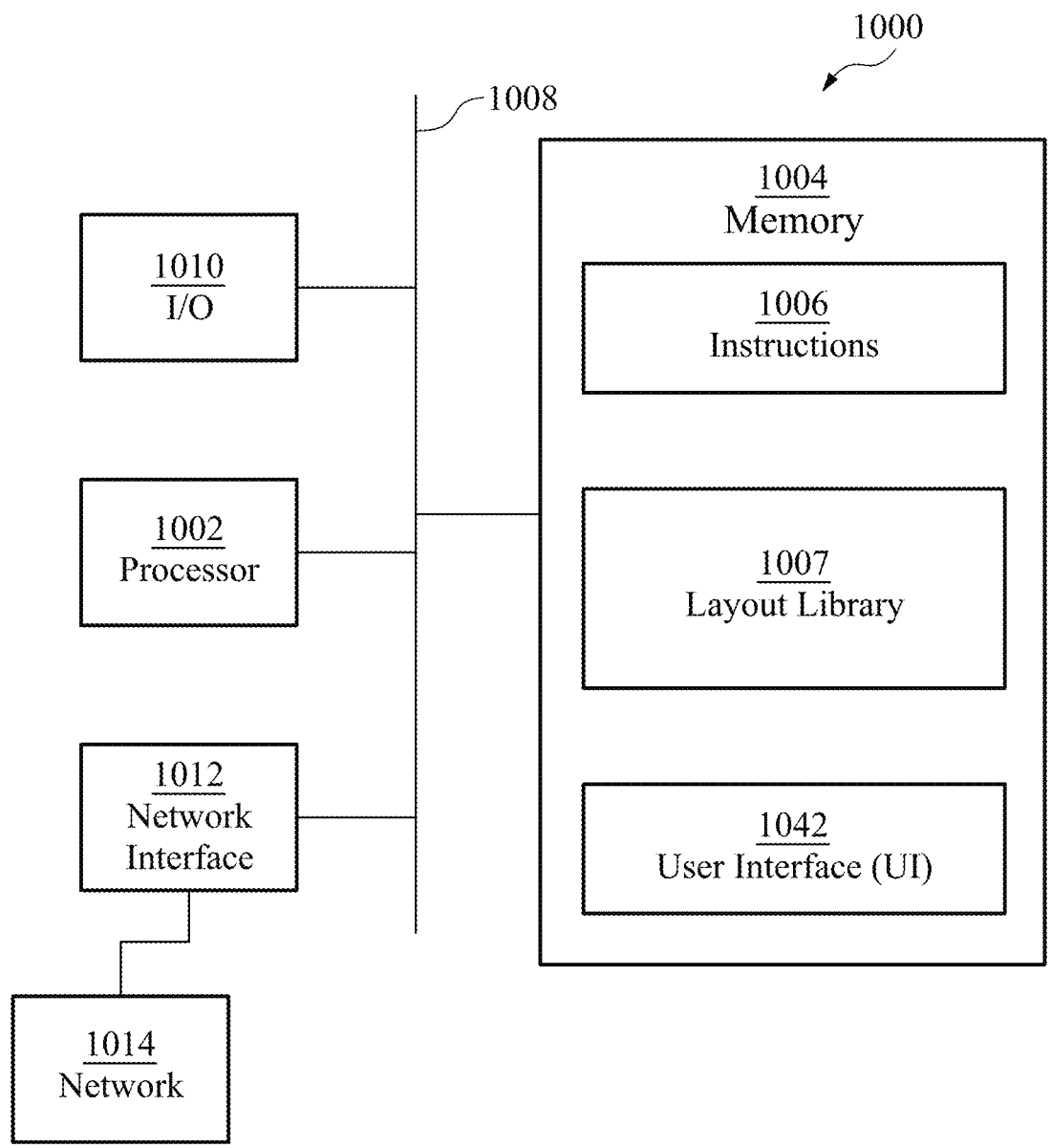
FIG. 10 is a block diagram of an IC layout diagram generation system, in accordance with some embodiments.

FIG. 10 is a block diagram of IC layout diagram generation system 1000, in accordance with some embodiments. Methods described herein of designing IC layout diagrams in accordance with one or more embodiments are implementable, for example, using IC layout diagram generation system 1000, in accordance with some embodiments.

In some embodiments, IC layout diagram generation system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of a method, e.g., method 900 of generating an IC layout diagram described above with respect to FIG. 9 (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause IC layout diagram generation system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, computer-readable storage medium 1004 stores computer program code 1006 configured to cause IC layout diagram generation system 1000 (where such execution represents (at least in part) the EDA tool) to be usable for performing a portion or all of the noted processes and/or methods. In one or more embodiments, computer-readable storage medium 1004 also stores information which facilitates performing a portion or all of the noted processes and/or methods. In one or more embodiments, computer-readable storage medium 1004 stores a layout library 1007 of IC layouts including such layouts as disclosed herein, e.g., IC layouts 100A-100E, 200A, 200C, 300A-300C, and 400-700 discussed above with respect to FIGS. 1A-7.

IC layout diagram generation system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

IC layout diagram generation system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 1000.

IC layout diagram generation system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. IC layout diagram generation system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
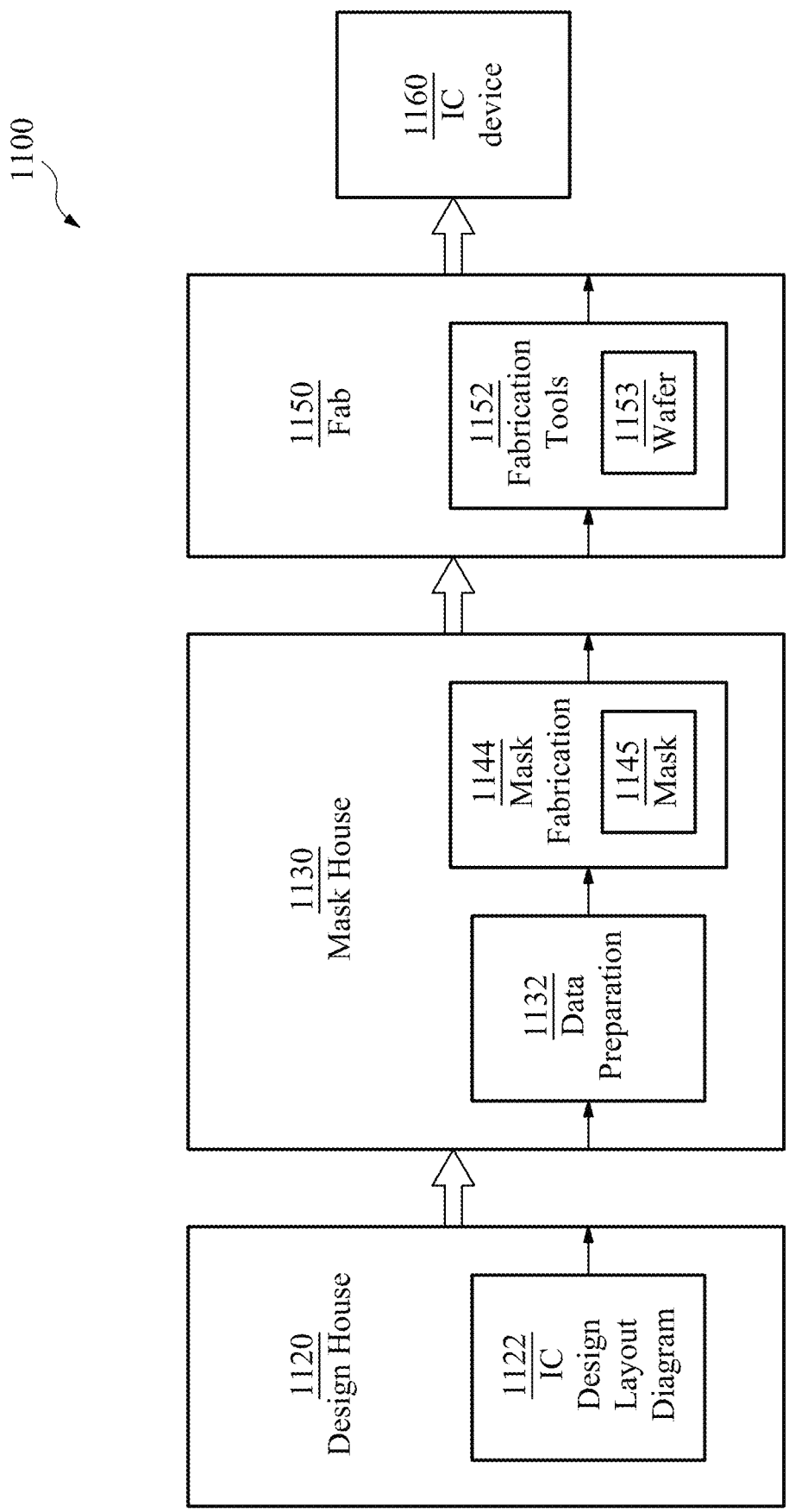
FIG. 11 is a block diagram of an IC manufacturing system, and an IC manufacturing flow associated therewith, in accordance with some embodiments.

FIG. 11 is a block diagram of IC manufacturing system 1100, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, e.g., a layout 100A-100E, 200A, 200C, 300A-300C, or 400-700 discussed above with respect to FIGS. 1A-7. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes wafer fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

In some embodiments, an IC structure includes first and second active areas extending in a first direction in a semiconductor substrate, first and second gate structures extending in a second direction perpendicular to the first direction, wherein each of the first and second gate structures overlies each of the first and second active areas, a first MD segment extending in the second direction between the first and second gate structures and overlying each of the first and second active areas, and an isolation structure positioned between the first MD segment and the first active area. The first MD segment is electrically connected to the second active area and electrically isolated from a portion of the first active area between the first and second gate structures.

In some embodiments, an IC structure includes a first power rail extending in a first direction in a semiconductor substrate, first and second active areas extending in the first direction in the semiconductor substrate, first and second gate structures extending in a second direction perpendicular to the first direction, wherein each of the first and second gate structures overlies each of the first and second active areas, a first MD segment extending in the second direction between the first and second gate structures and overlying each of the first and second active areas, and a first isolation structure positioned between the first MD segment and a portion of the first active area between the first and second gate structures. The portion of the first active area between the first and second gate structures is electrically connected to the first power rail, and the first MD segment is electrically connected to a portion of the second active area between the first and second gate structures and electrically isolated from the first power rail.

In some embodiments, a method of manufacturing an IC structure includes, in a semiconductor substrate, forming first and second active areas extending in a first direction, constructing first and second gate structures extending in a second direction perpendicular to the first direction, wherein each of the first and second gate structures overlies each of the first and second active areas, forming an isolation structure overlying a portion of the first active area between the first and second gate structures, and forming a first MD segment extending in the second direction and overlying each of the first and second active areas and the isolation structure. The first MD segment is electrically connected to the second active area and electrically isolated from the portion of the first active area between the first and second gate structures.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) structure comprising:
first and second active areas extending in a first direction in a semiconductor substrate;
first and second gate structures extending in a second direction perpendicular to the first direction, wherein each of the first and second gate structures overlies each of the first and second active areas;
a first metal-like defined (MD) segment extending in the second direction between the first and second gate structures and overlying each of the first and second active areas; and
an isolation structure positioned between the first MD segment and the first active area,
wherein the first MD segment is electrically connected to the second active area and electrically isolated from a portion of the first active area between the first and second gate structures.

2. The IC structure of claim 1, wherein
a dimension of the isolation structure in the first direction is greater than a dimension of the first MD segment in the first direction, and
a dimension of the isolation structure in the second direction is greater than a dimension of the first active area in the second direction.

3. The IC structure of claim 1, wherein
the first gate structure and the first active area are configured as a first transistor,
the second gate structure and the first active area are configured as a second transistor, and
the portion of the first active area between the first and second gate structures comprises a shared source/drain terminal of the first and second transistors.

4. The IC structure of claim 3, further comprising
a second MD segment positioned between the isolation structure and the first active area.

5. The IC structure of claim 1, further comprising:
a power rail positioned in a back side of the semiconductor substrate; and
a via structure configured to electrically connect the power rail to the portion of the first active area between the first and second gate structures.

6. The IC structure of claim 1, further comprising:
a buried power rail extending in the first direction adjacent to the first active area; and
a second MD segment configured to electrically connect the buried power rail to the portion of the first active area between the first and second gate structures,
wherein the second MD segment is positioned between the isolation structure and each of the buried power rail and the portion of the first active area between the first and second gate structures.

7. The IC structure of claim 1, further comprising:
a second MD segment overlying and electrically connected to the first active area, wherein the first gate structure is positioned between the first and second MD segments; and
a metal segment overlying each of the first and second MD segments, the first gate structure, and the isolation structure,
wherein the metal segment and the first MD segment are configured to electrically connect the second MD segment to a portion of the second active area between the first and second gate structures.

8. The IC structure of claim 7, further comprising:
a third MD segment positioned between the second MD segment and the first active area;
a fourth MD segment positioned between the isolation structure and the first active area; and
a fifth MD segment positioned between the first MD segment and the second active area.

9. The IC structure of claim 1, wherein
the isolation structure is a first isolation structure, and
the IC structure further comprises:
a third active area extending in the first direction between the first and second active areas; and
a second isolation structure positioned between the first MD segment and a portion of the third active area between the first and second gate structures,
wherein the first MD segment is electrically isolated from the portion of the third active area between the first and second gate structures.

10. An integrated circuit (IC) structure comprising:
a first power rail extending in a first direction in a semiconductor substrate;
first and second active areas extending in the first direction in the semiconductor substrate;
first and second gate structures extending in a second direction perpendicular to the first direction, wherein each of the first and second gate structures overlies each of the first and second active areas;
a first metal-like defined (MD) segment extending in the second direction between the first and second gate structures and overlying each of the first and second active areas; and
a first isolation structure positioned between the first MD segment and a portion of the first active area between the first and second gate structures,
wherein
the portion of the first active area between the first and second gate structures is electrically connected to the first power rail, and
the first MD segment is electrically connected to a portion of the second active area between the first and second gate structures and electrically isolated from the first power rail.

11. The IC structure of claim 10, wherein
the first power rail is positioned in a back side of the semiconductor substrate, and
the IC structure further comprises a via structure positioned between the first power rail and the portion of the first active area between the first and second gate structures.

12. The IC structure of claim 10, wherein
the first power rail comprises a buried power rail adjacent to the first active area, and
the IC structure further comprises:
a second MD segment electrically connected to the first power rail and positioned between the first isolation structure and the portion of the first active area between the first and second gate structures, and
a third MD segment positioned between the first MD segment and the portion of the second active area between the first and second gate structures.

13. The IC structure of claim 10, further comprising:
a second power rail extending in the first direction in the semiconductor substrate;

a third gate structure extending in the second direction and overlying each of the first and second active areas;

a second MD segment extending in the second direction between the second and third gate structures and overlying the second active area; and a second isolation structure positioned between the second MD segment and a portion of the second active area between the second and third gate structures, wherein the portion of the second active area between the second and third gate structures is electrically connected to the second power rail, and the second MD segment is electrically isolated from the second power rail.

14. The IC structure of claim 10, further comprising:

second and third power rails extending in the first direction in the semiconductor substrate;

third and fourth active areas extending in the first direction in the semiconductor substrate;

a plurality of MD segments extending in the second direction, wherein the plurality of MD segments comprise the first MD segment;

a plurality of isolation structures comprising the first isolation structure;

a plurality of gate structures extending in the second direction, wherein the plurality of gate structures comprises the first and second gate structures; and a plurality of metal segments extending in the first direction and overlying the pluralities of MD segments and gate structures, wherein the first through third power rails, the first through fourth active areas, the plurality of MD segments, the plurality of isolation structures, the plurality of gate structures, and plurality of metal segments extending in the first direction are configured as a flip-flop circuit.

15. The IC structure of claim 14, wherein the first through third power rails are an entirety of the power rails included in the flip-flop circuit, the first through fourth active areas are an entirety of the active areas included in the flip-flop circuit, the plurality of MD segments comprises a total of thirteen columns of MD segments extending in the second direction, and the plurality of gate structures comprises a total of fourteen gate structures extending in the second direction.

16. The IC structure of claim 14, wherein the first through third power rails are an entirety of the power rails included in the flip-flop circuit, the first through fourth active areas are an entirety of the active areas included in the flip-flop circuit, the plurality of MD segments comprises a total of twelve columns of MD segments extending in the second direction, the plurality of gate structures comprises a total of thirteen gate structures extending in the second direction, and the flip-flop circuit further comprises a plurality of metal segments extending in the second direction and overlying the plurality of metal segments extending in the first direction.

17. A method of manufacturing an integrated circuit (IC) structure, the method comprising:

in a semiconductor substrate, forming first and second active areas extending in a first direction;

constructing first and second gate structures extending in a second direction perpendicular to the first direction, wherein each of the first and second gate structures overlies each of the first and second active areas;

forming an isolation structure overlying a portion of the first active area between the first and second gate structures; and forming a first metal-like defined (MD) segment extending in the second direction and overlying each of the first and second active areas and the isolation structure, wherein the first MD segment is electrically connected to the second active area and electrically isolated from the portion of the first active area between the first and second gate structures.

18. The method of claim 17, further comprising:

forming a via structure extending from the portion of the first active area between the first and second gate structures to a back side of the semiconductor substrate; and constructing a power rail in the back side of the semiconductor substrate electrically connected to the via structure.

19. The method of claim 17, further comprising:

constructing a buried power rail extending in the first direction adjacent to the first active area; and forming a second MD segment configured to electrically connect the buried power rail to the portion of the first active area between the first and second gate structures, wherein the second MD segment is positioned between the isolation structure and each of the buried power rail and the portion of the first active area between the first and second gate structures.

20. The method of claim 17, further comprising:

forming a second MD segment overlying and electrically connected to the first active area, wherein the first gate structure is positioned between the first and second MD segments; and constructing a metal segment overlying each of the first and second MD segments, the first gate structure, and the isolation structure, wherein the metal segment and the first MD segment are configured to electrically connect the second MD segment to a portion of the second active area between the first and second gate structures.

* * * * *